US012787680B2

(12) United States Patent
Ono

(10) Patent No.: US 12,787,680 B2

(45) Date of Patent: Nov. 3, 2026

(54) VAPORIZER

(71) Applicant: LINTEC CO., LTD., Otsu (JP)

(72) Inventor: Hirofumi Ono, Otsu (JP)

(73) Assignee: LINTEC CO., LTD., Shiga (JP)

( * ) Notice: Subject to any disclaimer, the term of this patent is extended or adjusted under 35 U.S.C. 154(b) by 334 days.

(21) Appl. No.: 18/683,824

(22) PCT Filed: Nov. 11, 2021

(86) PCT No.: PCT/JP2021/041556

§ 371 (c)(1),
(2) Date: Feb. 15, 2024

(87) PCT Pub. No.: WO2023/062849

PCT Pub. Date: Apr. 20, 2023

(65) Prior Publication Data

US 2024/0355645 A1 Oct. 24, 2024

(30) Foreign Application Priority Data

Oct. 11, 2021 (JP) ................................ 2021-166820

(51) Int. Cl.
*H10P 72/00* (2026.01)

(52) U.S. Cl.
CPC ................................ *H10P 72/0402* (2026.01)

(58) Field of Classification Search
CPC .. H10P 72/0402; H10P 14/60; H10P 72/0602; H10P 14/29; H10P 72/0431; B01J 7/00; C23C 18/00
See application file for complete search history.

(56) References Cited

U.S. PATENT DOCUMENTS 6,296,711 B1 * 10/2001 Loan ................ C23C 16/45561 392/399
2019/0271079 A1 * 9/2019 Kusunoki .......... C23C 16/4402

FOREIGN PATENT DOCUMENTS

| | | | | |
|---|---|---|---|---|
| JP | 06-316765 | A | | 11/1994 |
| JP | 10-074745 | A | | 3/1998 |
| JP | 11087327 | A | * | 3/1999 |
| JP | 2001011634 | A | * | 1/2001 |
| JP | 2005-109349 | A | | 4/2005 |
| JP | 2006-503178 | A | | 1/2006 |
| JP | 2006-089780 | A | | 4/2006 |
| JP | 2010-003976 | A | | 1/2010 |

(Continued)

OTHER PUBLICATIONS

International Search Report mailed Dec. 28, 2021, for the corresponding international patent application No. PCT/JP2021/041556, with English translation.

(Continued)

*Primary Examiner* — Gregory A Wilson
(74) *Attorney, Agent, or Firm* — LUCAS & MERCANTI, LLP

(57) ABSTRACT

A vaporizer includes a liquid material introduction, a vaporized material discharge port, a vaporizer body, and a heater. The vaporizer body includes therein a vaporization unit extending from the liquid material introduction port to the vaporized material discharge port. A passage into which a liquid material flows is formed in the vaporization unit. The passage is formed such that a passage area thereof is increased toward the vaporized material discharge port from the liquid material introduction port.

3 Claims, 6 Drawing Sheets

(56) References Cited

FOREIGN PATENT DOCUMENTS

| | | | | | |
|---|---|---|---|---|---|
| JP | 6769645 | B1 | | 10/2020 | |
| KR | 19990006902 | A | * | 1/1999 | .............. H10P 14/60 |
| TW | 565626 | | | 12/2003 | |
| TW | 565626 | B | * | 12/2003 | ....... C23C 16/45561 |
| TW | 202043534 | A | | 12/2020 | |
| WO | WO-2011137127 | A1 | * | 11/2011 | ............. B05B 5/001 |
| WO | WO-2020021796 | A1 | * | 1/2020 | ........... B05B 7/1686 |
| WO | 2020/213104 | A1 | | 10/2020 | |
| WO | WO-2021054216 | A1 | * | 3/2021 | ......... C23C 16/4481 |

OTHER PUBLICATIONS

Taiwanese Office Action dated Mar. 8, 2023 for the corresponding Taiwanese Patent Application No. 111108760, with machine English translation.

* cited by examiner

VAPORIZER

CROSS REFERENCE TO RELATED APPLICATION

This Application is a 371 of PCT/JP2021/041556 filed on Nov. 11, 2021, which claimed priority of Japanese Application No. 2021-166820 filed on Oct. 11, 2021, both of which are incorporated herein by reference.

TECHNICAL FIELD

The present invention relates to a vaporizer capable of efficiently vaporizing a high-viscosity and high-boiling-point liquid material.

BACKGROUND ART

In recent semiconductor manufacturing processes, miniaturization and making device structures three-dimensional have been progressing. Along with this, a high-viscosity and high-boiling-point (low-vapor-pressure) liquid material has been used as material for deposition. In such a process, the following problems are involved.

The liquid material has high viscosity and thus does not flow well, and mass flow rate control thereof is extremely difficult. In other words, since the liquid material does not flow at room temperature, the viscosity thereof needs to be reduced. Thus, a material tank, a piping system extending to a vaporizer located downstream of the material tank, and a flow rate controller for liquid installed in the middle of the piping system need to be heated. Furthermore, such a liquid material has a high boiling point. Moreover, if not quickly vaporized, the high boiling point liquid material is thermally denatured, and generates a dimer or a multimer and is solidified, leading to a problem that a passage of the vaporizer is closed. Therefore, the vaporizer to be put in such a process is required to be able to efficiently vaporize an introduced liquid material. That is, to obtain a film thickness with high accuracy in such a semiconductor manufacturing process, a vaporizer that can control the flow rate of a liquid material with high accuracy and then quickly vaporize the same at a high temperature, is required.

A vaporizer described in Patent Literature 1 is proposed as a vaporizer capable of quickly vaporizing a large amount of liquid material. This vaporizer includes: an atomizer for atomizing and spouting a liquid material; a hollow outer tube, made of quartz glass, to which the atomizer is mounted; an inner tube made of quartz glass and housed in the outer tube; and an inner heater block made of metal, provided inside of the inner tube, and including an inner heater therein.

In the vaporizer, a narrow gap between the outer tube and the inner tube serves as a passage, and an atomized liquid material flows in the passage and is vaporized. Since the outer tube and the inner tube are made of quartz glass, the passage, which is a narrow gap therebetween, is formed so as to have the same width (in other words, the passage area described below being of a constant size) from an inlet to an outlet.

The liquid material that is jetted from the atomizer into an atomization space disposed at the top of the outer tube is atomized by carrier gas, and flows into the passage. The atomized liquid material receives heat from the inner tube and the outer tube to be vaporized during flowing in the passage, and the vaporized material (gas) is taken to the outside through the outlet disposed at the end of the passage.

In the vaporizer, an inner packed bed filled with graphite powder is formed between an inner peripheral surface of the inner tube made of glass and an outer peripheral surface of the inner heater block made of metal. The inner heater block made of metal is heated/cooled by turning on/off the inner heater, and the volume thereof expands/contracts. Therefore, the inner packed bed absorbs the expansion/contraction and constantly adheres closely to the inner tube and the inner heater block, thereby efficiently transmitting heat of the inner heater block to the inner tube. Accordingly, heat of the inner heater block is quickly transmitted to the atomized liquid material flowing in the passage, and, even if a large amount of the atomized liquid material flows into the passage, the large amount of the atomized liquid material can be smoothly vaporized.

CITATION LIST

Patent Literature

[PTL 1] Japanese Patent No. 6769645

SUMMARY OF INVENTION

Technical Problem

The vaporizer disclosed in Patent Literature 1 can quickly transmit heat of the inner heater block, via the inner packed bed of graphite powder, to the atomized liquid material flowing in the passage as described above. However, the atomized liquid material is vaporized as advancing in the passage, so that the volume thereof rapidly expands inside the narrow passage.

This passage is narrow, but provides a cylindrical space having a uniform width from the inlet to the outlet and having therein nothing that obstructs the flow. Thus, the atomized liquid material, and even the vaporized material (gas) expanded through vaporization smoothly flow in the passage. The vaporizer is improved such that heat of the inner heater block is quickly transmitted via the inner packed bed to the atomized liquid material flowing in the passage. However, with the configuration described above, the vaporization speed of the atomized liquid material is slow, with respect to the advancing speed of the atomized liquid material. To complete vaporization in the passage, the advancing speed of the atomized liquid material in the passage has to be reduced or the passage has to be made long and large. In the former case, the vaporization amount of the atomized liquid material is limited, and in the latter case, the shape of a device becomes large.

The present invention has been made to solve problems of such a conventional vaporizer. An object of the present invention is to provide a vaporizer that smoothly discharges a rapidly expanded vaporized material to prevent an increase in the internal pressure in the passage and can quickly process a larger amount of liquid material compared to the conventional vaporizer without enlarging the shape of a device.

Solution to Problem

One embodiment is directed to a vaporizer A including: a liquid material introduction port 11; a vaporized material discharge port 21; a vaporizer body 1 in which a passage 7, into which a liquid material L flows, is formed in a vaporization unit 3 extending from the liquid material introduction port 11 to the vaporized material discharge port 21; and a heater 5 that heats the liquid material L flowing in the passage 7.

The passage 7 is formed such that a passage area S represented by a cross-sectional area, of the passage 7, orthogonal to a flowing-through direction of the liquid material L is increased toward the vaporized material discharge port 21 from the liquid material introduction port 11.

In one embodiment, the passage 7 branches in the vaporization unit 3, and a divider 8 surrounded by the passage 7 that has branched is formed at a branch portion.

In one embodiment (FIG. 1 to FIG. 3, FIG. 9 to FIG. 11), the divider 8 is formed in a polygonal shape, and one of the corners of the polygon is disposed at a flow dividing point 7*k* of the passage 7.

In one embodiment (FIG. 1 to FIG. 3), the divider 8 has a hexagonal shape, and a plurality of the dividers 8 are arranged in multiple stages and multiple rows, in a tortoiseshell manner (pattern in which the hexagonal dividers 8 on a downstream side are arrayed between the hexagonal dividers 8 on an upstream side).

In one embodiment (FIG. 8), the divider 8 is formed in a circular or oval shape.

In one embodiment, a larger number of the dividers 8 are disposed on the downstream side than on the upstream side.

In one embodiment, ½ of a width W or a depth D of the passage 7 is formed in a range of a temperature boundary layer of the liquid material L.

Advantageous Effects of Invention

The passage 7 of the present invention is formed so as to have the passage area S increased toward the vaporized material discharge port 21 from the liquid material introduction port 11, and thus a vaporized material (vaporization gas) G2 having a volume rapidly expanded through vaporization can be quickly discharged from the passage 7. As a result, an increase in the internal pressure in the passage 7 can be suppressed, and vaporization of the liquid material L having flowed through the passage inlet 7*a* into the passage 7 or inflow of the liquid material L into the passage inlet 7*a* is not obstructed, so that a large amount of liquid material L can be processed compared to a conventional vaporizer having the same volume. As an additional effect, the vaporizer A can be downsized.

As an example in which the passage area S (S=s1+ . . . +sn) is increased, the passage 7 is formed so as to branch in the vaporization unit 3. When the passage 7 is formed so as to branch as described above, the vaporized material G2 having a volume rapidly expanded through vaporization in the passage 7 smoothly flows in the passage 7, which branches and the number of which is increased toward the vaporized material discharge port 21, and is discharged, so that an increase in the internal pressure in the passage 7 can be suppressed.

A divider 8 for dividing the passage 7 on the upstream side is formed at a branch portion and is surrounded by the passage 7, and thus heat from the heater 5 can be efficiently supplied through the divider 8 to a fluid (liquid material L or vaporized material G2) flowing in the passage 7.

Here, when each divider 8 is formed in a polygonal shape and one of the corners of the polygon is disposed at the flow dividing point 7*k* of the passage 7, the fluid (liquid material L or vaporized material G2) can be smoothly branched.

When the polygonal dividers 8 each have a regular hexagonal shape and are arranged in a tortoiseshell manner, the direction of each passage 7 continually changes toward the vaporized material discharge port 21 from the liquid material introduction port 11 in the entire vaporization unit 3, and the passages 7 having the uniform passage areas s1 to sn can be formed in the vaporization unit 3. Accordingly, the liquid material L is ensured to smoothly flow in the passage 7, retention time thereof is prolonged, and the liquid material L can be brought into contact with the dividers 8 for a longer time, so that the liquid material L can be more reliably vaporized.

Furthermore, when ½ of the width W or the depth D of the passage 7 is in the range of the temperature boundary layer of the liquid material L, the temperature of the liquid material L flowing in the passage 7 can be reliably increased to the vaporization temperature of the liquid material L or more, before the liquid material L reaches passage outlets 7*b*. In other words, no liquid material L remaining in a low-temperature and liquid state is discharged from the passage outlets 7*b*. All the liquid material L is reliably vaporized and heads to the vaporized material discharge port 21 through the passage outlets 7*b*.

DESCRIPTION OF EMBODIMENTS

Figure 1:
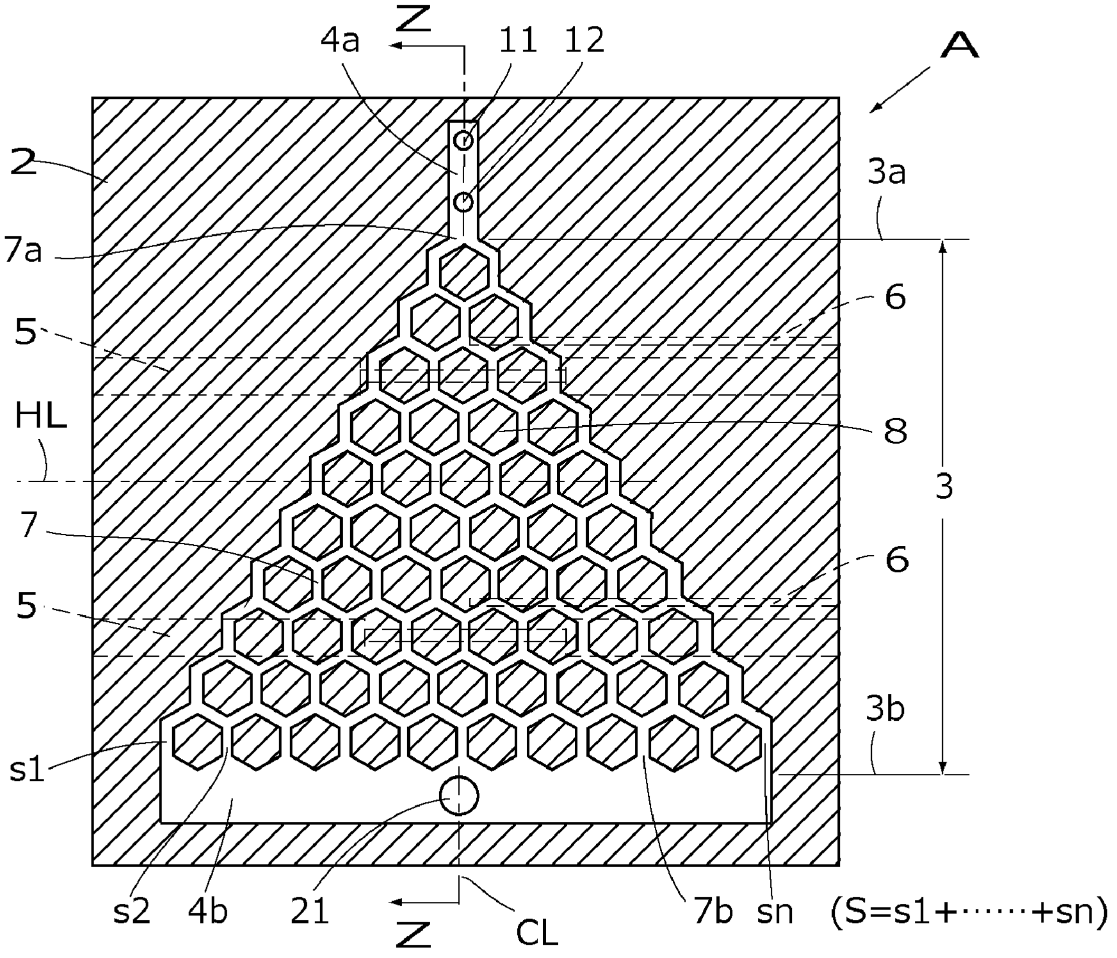
FIG. 1 is a longitudinal cross-sectional view showing an internal structure according to one embodiment of the present invention.

Hereinafter, the present invention will be described with reference to the drawings. A vaporizer A of the present invention is, for example, equipment that is used in a semiconductor manufacturing system, and includes: a liquid material introduction port 11; a carrier gas introduction port 12, which is provided as necessary; a vaporized material discharge port 21; a vaporizer body 1 in which a passage 7, into which a liquid material L flows, is formed in a vaporization unit 3 extending from the liquid material introduction port 11 to the vaporized material discharge port 21; and a heater 5 that heats the liquid material L flowing in the passage 7.

The vaporizer A of the present invention is required to quickly discharge, from the passage 7, a vaporized material G2 having a volume rapidly expanded through vaporization, to suppress an increase in internal pressure in the passage 7, and enable vaporization of the liquid material L to be promoted without delay, as described above. Therefore, the passage 7 of the vaporization unit 3 is basically formed such that a passage area S represented by a cross-sectional area of the passage 7 (when a plurality of the passages 7 are provided, the sum of the cross-sectional areas s1+ . . . +sn of the plurality of passages 7) orthogonal to a flowing-through direction of the liquid material L is increased toward the vaporized material discharge port 21 from the liquid material introduction port 11.

Here, "the passage area S of the passage 7 is increased toward the vaporized material discharge port 21 from the liquid material introduction port 11" includes the following cases: (1) the passage area S of one passage 7 is simply increased (gradually increased); (2) when the plurality of passages 7 are provided and the passage areas of the passages 7 are represented by s1 to sn, the total passage area S obtained by adding up the passage areas s1 to sn on a horizontal line HL at a right angle to a centerline CL of the vaporization unit 3 is increased (gradually increased); and (3) the passage 7 branches and the number of the passages 7 is increased toward the downstream side, that is, the increased number of the passages 7 increases (gradually increases) the total passage area S.

In addition, a "range" in which the passage area S of the passage 7 is increased toward the vaporized material discharge port 21 from the liquid material introduction port 11 may extend over the entire length of the vaporization unit 3 including the passage 7 therein, but may also end when the temperature of a gas material G2 reaches a predetermined temperature and the gas material G2 no longer expands.

In addition, examples of a method for supplying the liquid material L include: a case where a carrier gas G1 is used and the liquid material L is atomized and supplied to the vaporization unit 3; and a case where no carrier gas G1 is used and only the liquid material L is supplied to the vaporization unit 3.

In a first embodiment of the vaporizer A, dividers 8 each have an "island shape" formed in a polygonal shape, or a circular or oval shape. The first embodiment will be described below, using a case where the dividers 8 each have a hexagonal shape out of the above shapes and are arranged in a tortoiseshell manner as a representative example (first mode of the first embodiment), and using the other cases as second, third, and fourth modes of the first embodiment. Even among the cases, a case where the carrier gas G1 is used and a case where only the liquid material L is used will be described separately.

The "tortoiseshell manner pattern" is a pattern in which hexagons are arranged in multiple stages and multiple rows in a zigzag manner, and that the hexagons at a lower stage are arrayed between the hexagons at an upper stage. It is needless to say that the passage 7 is formed between the hexagonal dividers 8.

Figure 7:
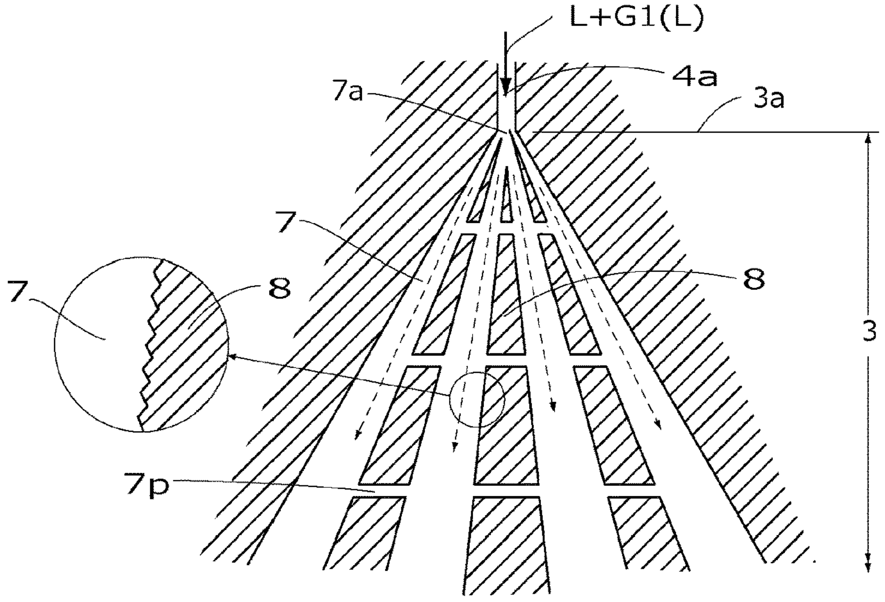
FIG. 7 is a partial longitudinal cross-sectional view showing an internal structure according to another embodiment of the present invention.

An example shown in FIG. 7 will be described as a second embodiment in a last part.

The first mode of the first embodiment shown in FIGS. 1 to 5 will be firstly described as a representative example, differences from the representative example will be described in the other embodiments, and for the same matters, description for the representative example is applied to description for the other embodiment.

First Mode of First Embodiment

The vaporizer body 1 includes a plate-shaped base plate 2 and a plate-shaped cover plate 10, and the cover plate 10 is bonded (e.g., diffusion bonded) over the entirety of one surface (to-be-covered surface 2*a*) of the base plate 2. The base plate 2 and the cover plate 10 are formed of a corrosion-resistant metal such as stainless steel. The above diffusion bonding is a method for bonding the cover plate 10 and the base plate 2, which are metal plates, by heating the plates to a high temperature under a vacuum and applying a load under high pressure. The bonded part is completely hermetically bonded. The vaporizer body 1 has a plate-shaped appearance.

On the to-be covered surface 2*a*, covered by the cover plate 10, of the base plate 2, grooves (trenches) forming the passage 7, and an introduction space 4*a* and a discharge space 4*b* described below are formed. A part in which the passage 7 is formed is referred to as vaporization unit 3. The passage 7, the introduction space 4*a*, and the discharge space 4*b* are hermetically covered by the cover plate 10.

The shape of the vaporization unit 3 is an isosceles triangle shape in a plan view, and a vaporization unit starting end 3*a* is located at the top of the vaporization unit 3. In the drawings, the introduction space 4*a* is provided on an upper side of the vaporization unit starting end 3*a* and extends in the up-down direction, and the vaporization unit starting end 3*a* is connected to a lower end of the introduction space 4*a*. The liquid material introduction port 11 is provided to the introduction space 4*a*. In this embodiment, the carrier gas introduction port 12 is further provided on the vaporization unit starting end 3*a* side, and a spraying function by the carrier gas G1 is ensured in the introduction space 4*a*. The liquid material introduction port 11 and the carrier gas introduction port 12 are formed in an upper end portion of the back surface of the base plate 2.

When the above carrier gas introduction port 12 is provided and the carrier gas G1 is used, introduction of the liquid material L and discharge of the gas material G2 can be advantageously performed quickly (in the contrary case, when only the liquid material L is supplied and no carrier gas G1 is used as described below, the carrier gas introduction port 12 is unnecessary).

At a vaporization unit end 3*b*, which is the base of the vaporization unit 3, a plurality of passage outlets 7*b* are open, and the plurality of passage outlets 7*b* are connected to the discharge space 4*b*. The vaporized material discharge port 21 is provided to the discharge space 4*b*. The discharge space 4*b* and the passage area of the vaporized material discharge port 21 are each larger than the total passage area S of a plurality of passages 7 that are open to the discharge space 4*b* so that discharge of the vaporized material G2 having flowed out of the plurality of passages 7 is not obstructed. The vaporized material discharge port 21 is formed in a lower end portion of the back surface of the base plate 2.

Next, detailed structures (i.e., the sizes and the shapes the divider 8 and the passage 7) of the vaporization unit 3 are properly selected according to the type or the usage of a product, or physical properties (viscosity, specific heat, vaporization heat, molecular weight, vapor pressure, etc.) of the liquid material L to be vaporized. In the embodiment, regarding the shape and the arrangement of the dividers 8, the dividers 8 each have a regular hexagonal shape and are arranged in a tortoiseshell manner, as described above. Other forms will be described in detail below. The size of each of the dividers 8 will be described below.

Next, regarding the size of the passage 7, the passage 7 is surrounded by wall surfaces 7*h* and is heated from the entire periphery thereof, and thus, as described below, it is preferable that ½ of at least one of a width W and a depth D of the passage 7 does not exceed a "temperature boundary layer", in which the liquid material L has a fixed temperature, from the wall surface 7*h*. It is extremely difficult to vaporize the high-boiling-point and low-vapor-pressure liquid material L, but, for the above, heat transfer to the liquid material L can be improved and vaporization can be facilitated.

The "temperature boundary layer" refers to a range in which the liquid material L flowing away from the wall surface 7*h* has a uniform flow temperature. That is, assuming that the temperature of each wall surface 7*h*, of the base plate 2 or the cover plate 10, facing the passage 7 is a wall surface temperature, the temperature of a fluid flowing in the passage 7 decreases as a distance from the wall surface 7*h* increases, but is fixed (uniform flow temperature) when reaching a certain temperature. In this case, the entire periphery of the passage 7 is surrounded by the wall surfaces 7*h*. Thus, when a range from each wall surface 7*h* to the center of the passage 7 is set to be equal to or smaller than a range of the "temperature boundary layer", all the liquid material L flowing in the passage 7 is heated to the vaporization temperature and any liquid material L remaining in a liquid state does not pass through the passage 7.

That is, with the wall surface temperature being set such that the temperature of the "temperature boundary layer" is higher than the vaporization temperature, all the liquid material L flowing in the passage 7 is vaporized.

The passage 7 is formed so as to branch in the vaporization unit 3 and such that the number of the passages 7 is increased toward the vaporization unit end 3*b* from the vaporization unit starting end 3*a*. The increased number of the passages 7 increases the passage area S.

The passage area S is preferably increased over the entire length of the vaporization unit 3. However, as long as discharge of the vaporized material G2 having a volume sharply increased through vaporization is not obstructed, the passage area S need not be increased over the entire length of the vaporization unit 3. Although not shown, in a portion, near the vaporization unit end 3*b*, in which the temperature of the vaporized material G2 flowing in the vaporization unit 3 becomes close to the predetermined temperature and the volume expansion thereof stops, the passages 7 may extend straight toward the passage outlets 7*b* without branching, and an increase in the passage area S may stop at the portion.

The passage area S refers to the cross-sectional area of the passage 7 orthogonal to a flow direction of the liquid material L (when a plurality of the passages 7 are provided, the sum of the cross-sectional areas).

As shown in FIG. 1, the passage area S of the passage 7 at a certain position is the cross-sectional area of the passages 7 at a right angle to the flowing-through direction of the liquid material L (gas material G2) heading to the vaporization unit end 3*b* from the vaporization unit starting end 3*a*, on the horizontal line HL orthogonal to the centerline CL of the vaporizer body 1 extending from the vaporization unit starting end 3*a* to the vaporization unit end 3*b*. When the number of the passages 7 is n, the passage area S of the passages 7 is the sum (S=s1+ . . . +sn) of the cross-sectional areas (s1 to sn) of the passages 7.

A planar shape of the vaporization unit 3 (in a plan view state in which the cover plate 10 is removed) is, for example, a triangle shape (isosceles triangle shape in the drawing) having a width increased toward the vaporization unit end 3*b* from the vaporization unit starting end 3*a*. The introduction space 4*a* that communicates with the vaporization unit starting end 3*a* and extends upward from the vaporization unit starting end 3*a*, is provided at the top of the vaporization unit 3, the passage 7 extending from the top of the introduction space 4*a* to the base of the vaporization unit 3 is formed inside the vaporization unit 3, and the discharge space 4*b* to which the passage outlets 7*b* of the passages 7 are open is provided at the base.

The passage 7 provided in the vaporization unit 3 has one passage inlet 7*a* at the vaporization unit starting end 3*a*, and branches toward the vaporization unit end 3*b* from the vaporization unit starting end 3*a*, so that the passage outlets 7*b* of the plurality of passages 7 are open to the discharge space 4*b* at the vaporization unit end 3*b* as described above.

Out of the passages 7 formed by branching on the upstream side, the passages 7 adjacent to each other join and are connected to each other on the downstream side. The portions surrounded by the passage 7 are the dividers 8. In other words, branching of the passage 7 is caused by the dividers 8 provided in the vaporization unit 3. The dividers 8 are provided such that the number thereof is increased toward the vaporization unit end 3*b* from the vaporization unit starting end 3*a*. Accordingly, the plurality of passages 7 are open at the vaporization unit end 3*b* as described above.

The dividers 8 of the embodiment each have a hexagonal shape in a plan view (regular hexagonal shape in the drawings) as described above, and are arranged at regular intervals in a tortoiseshell manner. Therefore, the passage 7 formed between the dividers 8 and the passage 7 formed between the outside divider 8 and the side wall of the base plate 2 each have the same width W and depth D from the vaporization unit starting end 3*a* to the vaporization unit end 3*b*.

Figure 4:
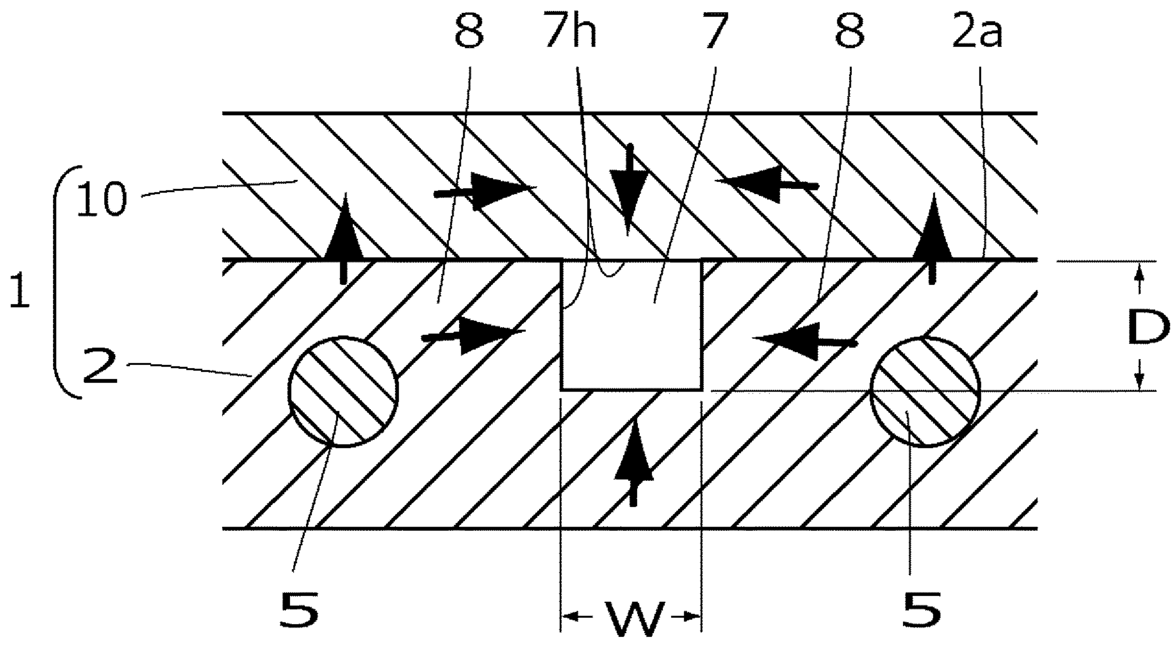
FIG. 4 is a partially enlarged sectional view of the passage in FIG. 3.
Figure 5:
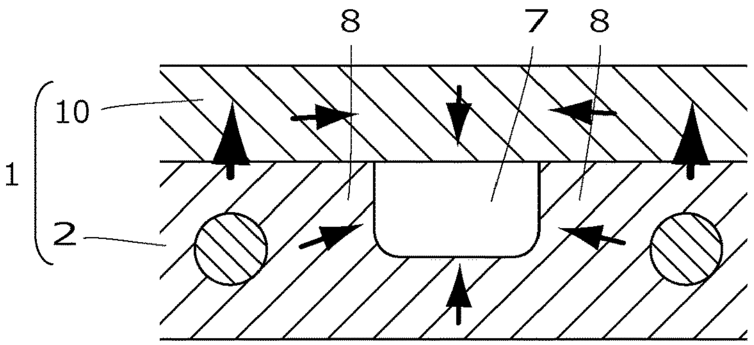
FIG. 5 is another partially enlarged sectional view of the passage in FIG. 3.

The passage 7 is configured as a groove having a rectangular cross section as shown in FIG. 4. FIG. 5 shows another example in which the passage 7 is configured as a groove that has a semicircular cross section or a bottom portion with corners each formed in a circular arc shape. The depth of the passage 7 is denoted by D, and the width thereof is denoted by W as described above. FIG. 4 is shown as D:W=1:1, and FIG. 5 is shown as D:W=1:2. It is needless to say that these are examples and the present invention is not limited thereto. The depth D and the width W of the passage 7 or either one thereof is very small, and is formed such that the temperature, of the liquid material L flowing in the passage 7, from the wall surface 7*h* is in the range of the "temperature boundary layer". The depth D of the passage 7 is preferably 0.5 mm+0.25 mm. The width W is not particularly limited, but is preferably 0.5 mm to 1 mm.

Grooves forming the passage 7, the introduction space 4*a*, and a discharge space 4*b* are produced by machining or chemical etching.

Each divider 8 is formed in order to smoothly transmit heat from the heater 5 to the liquid material L flowing in the passage 7 via the base plate 2 or the cover plate 10, and thus may be formed in any shape that does not obstruct such heat transmission. Therefore, the planar shape of the divider 8 is not particularly limited, and examples of the planar shape include a polygon (a triangle, a rectangle, a pentagon, a hexagon, a heptagon, an octagon, or polygon with more angles), and a circle or an oval. Out of these, from the viewpoint of smoothing the flow of a fluid (liquid material L or gas material (gas) G2), hexagons (regular hexagons in the drawings) are most preferably arranged in a tortoiseshell manner, and such arrangement is used as the embodiment. Considering the above, a range in which a width 8*w* (and a height 8*h*) of the divider 8 is 10 mm+5 mm is appropriate.

If the number of the dividers 8 is increased toward the vaporization unit end 3*b* from the vaporization unit starting end 3*a*, the arrangement structure thereof is also not particularly limited. However, each divider 8 (particularly, corner portion thereof) on the downstream side is preferably arranged just below the passage 7 on the upstream side such that the flow of the passage 7, on the upstream side, between the dividers 8 on the upstream side is equally divided to the left and right. In the present embodiment, as one example, the dividers 8 are arranged in a tortoiseshell manner.

In addition, to facilitate dividing the flow of the passage 7 on the upstream side and to generate no stagnation in the flow of the fluid (liquid material L or vaporized material G2), one of the corners of the hexagonal divider 8 is set so as to be arranged just below the passage 7 on the upstream side. It is needless to say that the same applies to another polygon.

Figure 2:
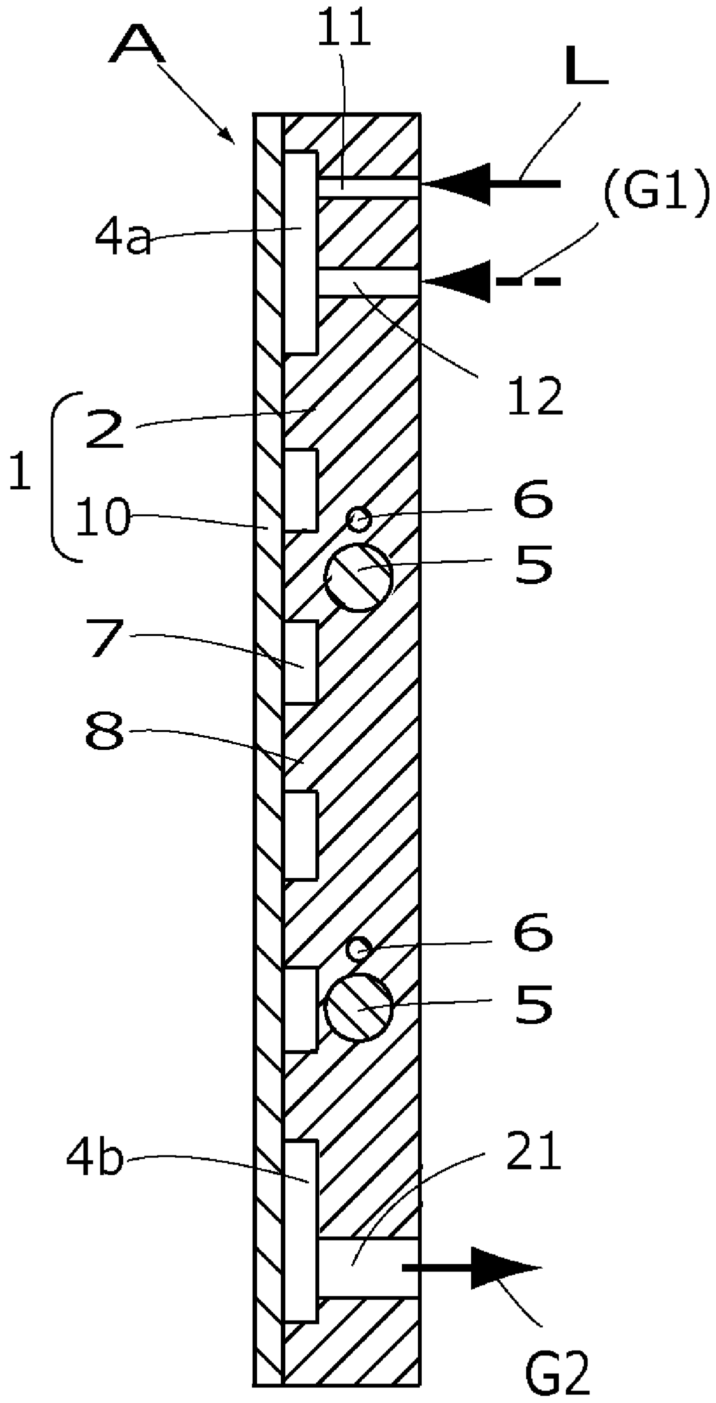
FIG. 2 is a cross-sectional view taken along arrows Z-Z in FIG. 1.
Figure 3:
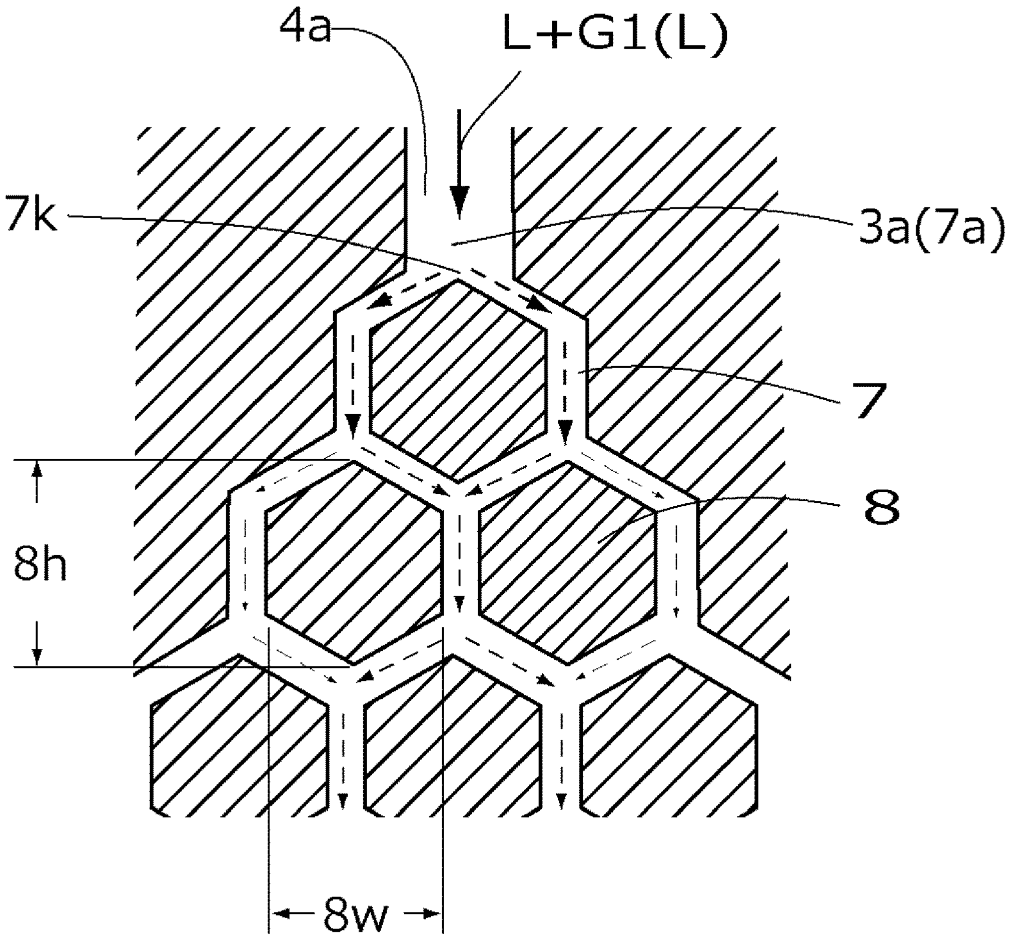
FIG. 3 is a partially enlarged plan view of a passage in FIG. 1.

In the embodiment shown in FIG. 2, two bar-shaped heaters 5 are horizontally inserted in upper and lower portions of the base plate 2, respectively. Although not shown, it is needless to say that the two bar-shaped heaters 5 may be inserted in the vertical direction. Instead of the bar-shaped heaters 5, planar heaters, which are not shown, may be attached to the base plate 2 and the cover plate 10.

A temperature sensor 6 is mounted in the vicinity of the bar-shaped heater 5.

Figure 6:
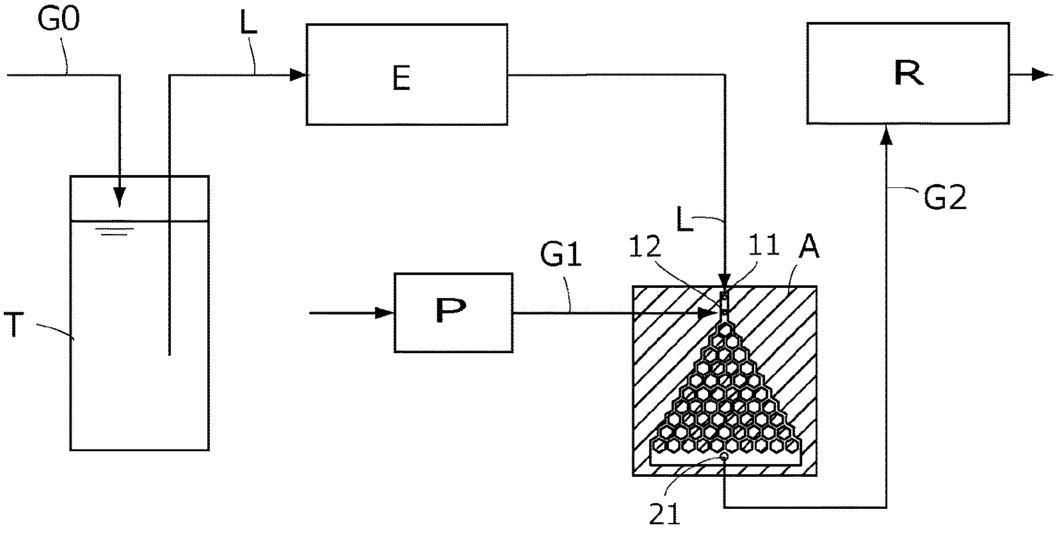
FIG. 6 is a schematic flow diagram of the entire system using a vaporizer of the present invention.

FIG. 6 shows one example of a configuration of a semiconductor manufacturing apparatus in which the vaporizer A of the present invention is used, and includes a material tank T, a liquid flow rate controller E, a mass flow rate controller P (provided when the carrier gas G1 is used), the vaporizer A of the present invention, a reaction furnace R, and a piping system connecting these.

The liquid material L is stored in the material tank T, and the liquid material L is sent out to the liquid flow rate controller E by the pressurized gas G0.

The liquid flow rate controller E is connected to the material tank T, and sends out the liquid material L, supplied from the material tank T, by a constant fixed mass flow rate to the liquid material introduction port 11 of the vaporizer A.

The mass flow rate controller P is connected to the carrier gas supply source, and sends out the carrier gas G1 by a mass flow rate to the carrier gas introduction port 12 of the vaporizer A.

The liquid material introduction port 11 of the vaporizer A is connected to the liquid flow rate controller E via the liquid material supply piping, and the mass flow rate controller P is connected to the carrier gas introduction port 12 via the carrier gas supply piping. The vaporized material discharge port 21 is connected to, for example, the reaction furnace R for oxidation of a silicon substrate via a vaporized material supply piping.

The material tank T, the liquid material supply piping from the material tank T to the vaporizer A via the liquid flow rate controller E, the vaporizer A, the liquid flow rate controller E, and the vaporized material supply piping are kept warm.

The vaporizer A has a flat-plate-like outer shape, and thus is not voluminous even if being directly mounted to the reaction furnace R.

Next, operation of the vaporizer A of the present invention will be described. When the heater 5 of the vaporizer A is energized and increases the temperature, heat is transmitted to a portion around the passage 7.

In this state, the pressurized gas G0 is supplied to the material tank T, and the liquid material L is supplied by a constant mass flow rate from the liquid flow rate controller E to the liquid material introduction port 11 of the vaporizer A as described above. Meanwhile, similarly, the carrier gas G1 is injected by a mass flow rate from the mass flow rate controller P into the carrier gas introduction port 12, and the liquid material L, which has been atomized, is injected from an outlet of the introduction space 4*a*, that is, the vaporization unit starting end 3*a*, into the vaporization unit 3.

The atomized liquid material L injected into the vaporization unit 3 hits the divider 8 in the first row located at the vaporization unit starting end 3*a*. In the present embodiment, since each divider 8 has a hexagonal shape and one of the corners thereof is oriented to the introduction space 4*a* side, the jetted atomized liquid material L is equally divided to the left and right at the corner. The atomized liquid material L that has branched to the left and right flows along the passages 7 formed around the first divider 8.

The divided atomized liquid material L flows in the passages 7 formed between the divider 8 in the first row and an inner wall of the vaporization unit 3, and reaches the second row. In the second row, each half of the divided atomized liquid material L flows in the passage 7 between the divider 8 in the second row and the first divider 8, joins the other half thereof at an end portion of the divider 8 in the first row, flows in the passage 7 between the dividers 8 in the second row as it is, and again branches at an upper end corner portion of the dividers 8 in the third row.

The remaining atomized liquid material L, which has flowed on the outside in the second row, flows along the inner wall of the vaporization unit 3. Subsequently, division and joining of the flow is repeated by successively repeating the above.

The divided atomized liquid material L is rapidly heated by coming into contact with the wall surface 7*h* of the passage 7 or by heat from the wall surface 7*h*, and is sequentially vaporized in the flow. When the size (width W or depth D) of the passage 7 is in the range of the "temperature boundary layer" (a range not exceeding double the "temperature boundary layer" at most), the entire inside of the passage 7 is maintained at the vaporization temperature or higher to vaporize all the atomized liquid material L in the flow, and such a short circuit phenomenon that fine particles remaining in a liquid state pass through the passage 7 and reach each passage outlet 7*b* does not occur.

The atomized liquid material L is sequentially vaporized in the flow and then the volume thereof rapidly expands. However, the passage 7 is continuous so as to form a mesh pattern, the passage area S thereof is sharply increased toward the vaporization unit end 3*b*, and thus the vaporized material G2 flows so as to be divided in the passage 7 and does not increase the internal pressure in the passage 7. Therefore, since the internal pressure in the passage 7 is not increased, the liquid material L smoothly flows in the vaporization unit 3 and is vaporized.

Each passage 7 changes the direction at short intervals as described above, and thus a fluid (atomized liquid material L or vaporized material G2) is agitated and the chance that the fluid is brought into contact with the wall surface 7*h* is dramatically increased, leading to quick temperature increase.

The vaporized material G2 flows into the discharge space 4*b* through each passage outlet 7*b*, and is supplied to the reaction furnace R through the vaporized material discharge port 21 formed in the discharge space 4*b* without increasing the internal pressure inside the equipment.

A case where the carrier gas G1 is used has been described above, and a case where no carrier gas G1 is used will be described next.

When no carrier gas G1 is used, the liquid material L drops or flows down as it is, comes into contact with the divider 8 in the first row, and is divided to the left and right as described above. The flow of the liquid material Lis the same as in the above, but the liquid material L flows mainly in the passages 7 around the dividers 8 in a middle portion arrayed along the centerline CL in this case.

Then, the vaporized material G2 vaporized in the flow is diffused into both the passages 7, and flows out into the discharge space 4*b* evenly through the passage outlets 7*b*.

Second Mode of First Embodiment

Figure 8:
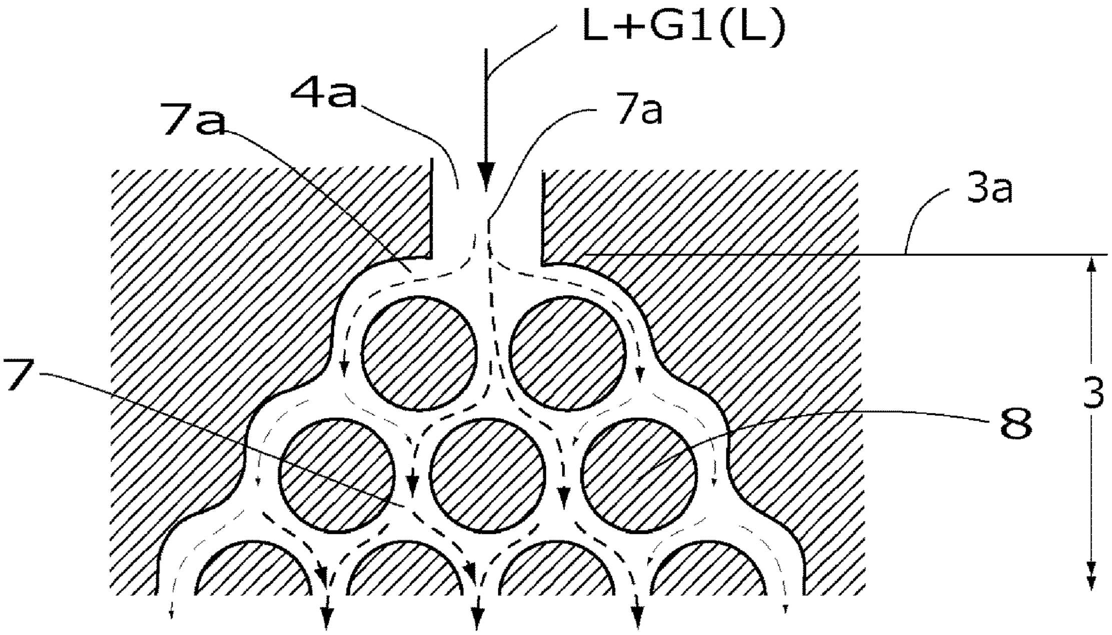
FIG. 8 is a partially enlarged view of second dividers of the present invention.

In this case, each divider 8 has a shape other than a hexagonal shape. If the dividers 8 each have a circular shape, as in a tortoiseshell pattern, the dividers 8 are arranged such that each circular divider 8 on the downstream side is located just below the passage 7 between the circular dividers 8 on the upstream side (FIG. 8). In FIG. 8, two dividers 8 and the passage 7 therebetween are provided in the first row (although not shown, one divider 8 may be provide in the first row).

Accordingly, as in the above, the atomized liquid material L jetted into the vaporization unit 3 together with the carrier gas G1 is caused to branch at each circular divider 8 and flows downstream, and is vaporized in the meantime. In this case, the size of the each passage 7 formed between the circular dividers 8 is not constant. Compared to a portion in which the circular dividers 8 are close to each other, the interval between the circular dividers 8 is increased and the flow speed is decreased at a flow dividing portion, thereby forming minute vortexes. If a minute turbulent flow is generated at this portion, the flow speed is decreased and the chance that the wall surface 7*h* and the material (liquid material L or vaporized material G2) are brought into contact with each other is increased, leading to rapid temperature increase.

Third Mode of First Embodiment

Figure 9:
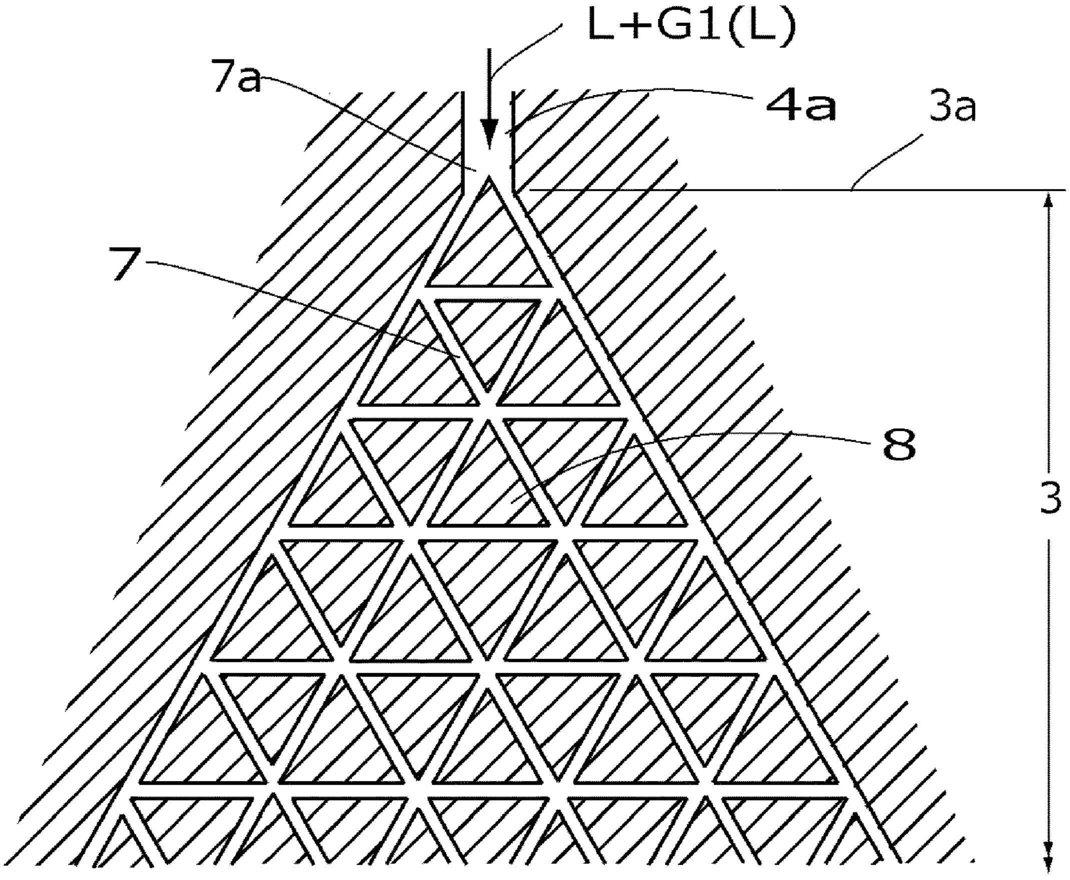
FIG. 9 is a partially enlarged view of third dividers of the present invention.
Figure 10:
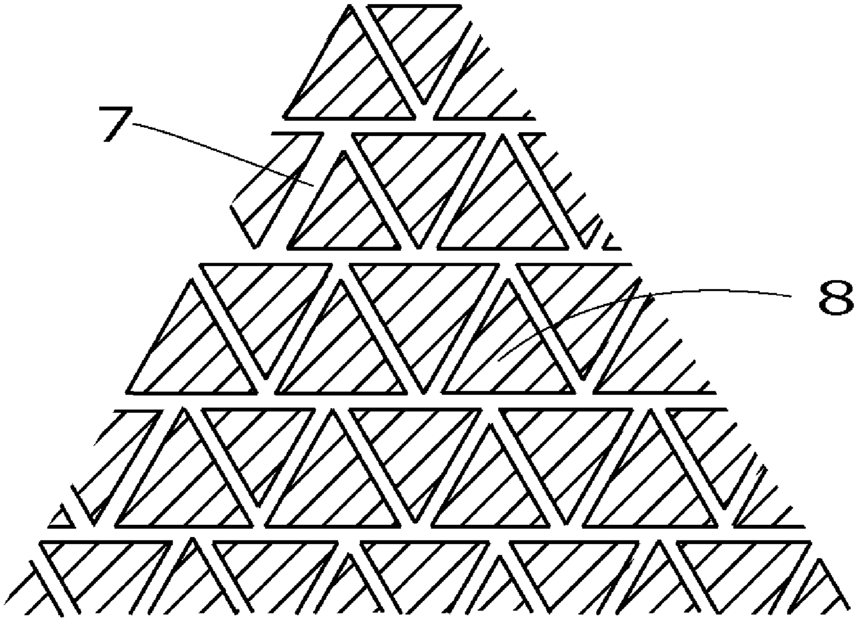
FIG. 10 illustrates another arrangement example of the dividers in FIG. 9.

In this case, each divider 8 has a triangle shape (equilateral triangle shape in FIG. 9 and FIG. 10). In FIG. 9, the divider 8 having an apex oriented upward and the divider 8 having an apex oriented downward are alternately arranged, and are arranged in multiple rows so as to have the increased number of the dividers 8 toward the downstream side.

FIG. 10 shows an example in which lateral-direction rows are displaced from each other by a half-width of the base of the triangle in the horizontal direction, with respect to the arrangement in FIG. 9.

Each passage 7 is formed so as to have the same width W and the depth D in the entire vaporization unit 3.

Fourth Mode of First Embodiment

Figure 11:
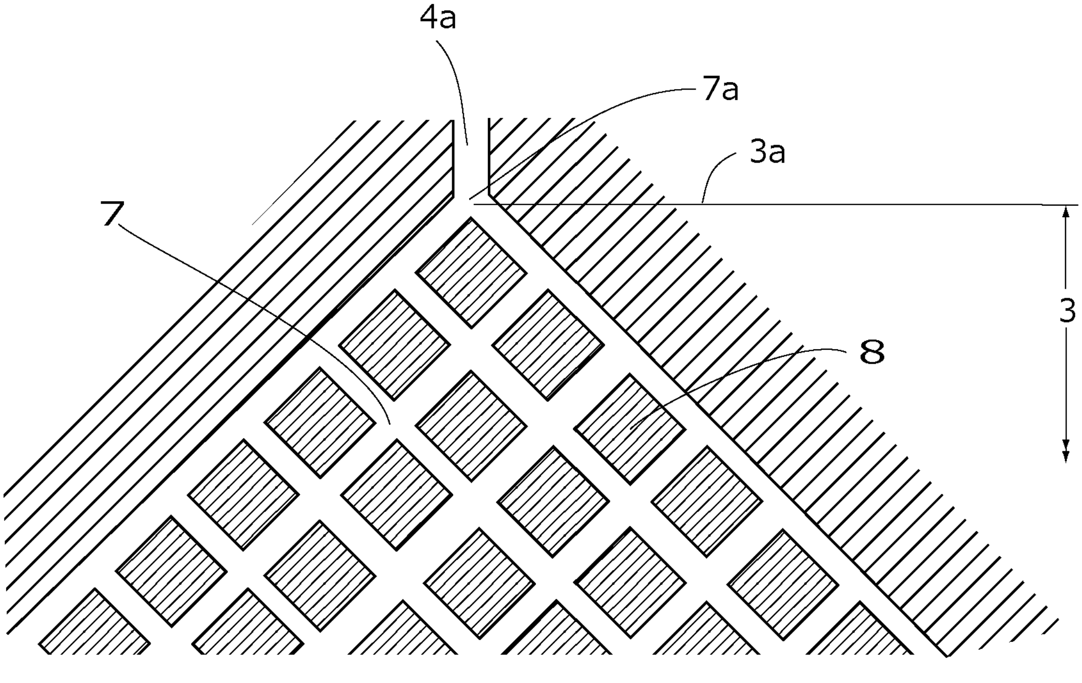
FIG. 11 is a partially enlarged view of fourth dividers of the present invention.

In this case, each divider 8 has a rectangle shape (square shape in FIG. 11). FIG. 11 shows an example in which each divider 8 is arranged such that one of the corners thereof is oriented to an inflow side, and the dividers 8 are arranged in multiple rows so as to have the increased number of the dividers 8 toward the downstream side.

In this case as well, each passage 7 is formed so as to have the same width W and the same depth D in the entire vaporization unit 3.

Second Embodiment

This is an example in which one (not shown) to a plurality of the passages 7 are provided toward the vaporization unit end 3*b* from the vaporization unit starting end 3*a*. The passage 7 is formed so as to have the passage area S increased toward the vaporized material discharge port 21 from the liquid material introduction port 11. In the drawing, each passage 7 is formed such that the depth D is in the range of the "temperature boundary layer" (is in a range not exceeding double the "temperature boundary layer" at most) and such that the width W is increased.

The passage area S of the passage 7 is increased over the entire length of the passage 7 as described above or on the upstream side relative to where vaporization of the liquid material L finishes.

Each passage 7 in the drawing is formed linearly, and the wall surface 7*h* thereof may be provided with a concave-convex pattern as shown in an enlarged view. Accordingly, the area of contact between the liquid material L and the wall surface 7*h* of the passage 7 is increased and the flow speed of the liquid material L flowing thereon becomes slow, leading to quick temperature increase of the liquid material L.

In addition, when the plurality of passages 7 are provided, a bypass 7*p* connecting the adjacent passages 7 is preferably provided. The liquid material L and the vaporized material G2 intercommunicate between the adjacent passages 7 through the bypass 7*p*, and the internal pressure in the vaporization unit 3 is equalized.

Although not shown, the passage 7 may be meandered.

As described above, the vaporizer A of the present invention is configured to have the increased passage area S (increased number) of the passage 7 toward the downstream side. Thus, even when the volume of the liquid material L is increased through vaporization thereof, an increase in the internal pressure in the passage 7 is suppressed and the liquid material Lis efficiently vaporized. Therefore, the vaporizer A can also be downsized, and be easily mounted to the reaction furnace R (film formation device). The structure of the vaporizer A is extremely simple, thereby enabling cost reduction in conjunction with downsizing.

REFERENCE SIGNS LIST

A vaporizer
CL centerline
D depth of passage
E liquid flow rate controller
G0 pressurized gas
G1 carrier gas
G2 vaporized material (gas)
HL horizontal line
L liquid material
P mass flow rate controller
R reaction furnace
S (s1 to sn) passage area
T material tank
W width of passage
1 vaporizer body
2 base plate
2*a* to-be-covered surface
3 vaporization unit
3*a* vaporization unit starting end
3*b* vaporization unit end
4*a* introduction space
4*b* discharge space
5 heater
6 temperature sensor
7 passage
7*a* passage inlet
7*b* passage outlet
7*h* wall surface

7*k* flow dividing point
7*p* bypass
8 divider
8*h* height of divider
8*w* width of divider
10 cover plate
11 liquid material introduction port
12 carrier gas introduction port
21 vaporized material discharge port

The invention claimed is:

1. A vaporizer comprising:

a liquid material introduction port;

a vaporized material discharge port;

a vaporizer body in which a passage, into which a liquid material flows, is formed in a vaporization unit extending from the liquid material introduction port to the vaporized material discharge port; and a heater that heats the liquid material flowing in the passage, wherein the passage is formed such that a passage area represented by a cross-sectional area, of the passage, orthogonal to a flowing-through direction of the liquid material is increased toward the vaporized material discharge port from the liquid material introduction port, the passage branches in the vaporization unit, and dividers surrounded by the passage that has branched are formed at branch portions, each of the dividers is formed in a hexagonal shape, and one of the corners of the hexagon is disposed at a flow dividing point of the passage, and the dividers are arranged in multiple stages and multiple rows such that one of the dividers on a downstream side is arrayed between two of the dividers on an upstream side.

2. The vaporizer according to claim 1, wherein the dividers are disposed more on the downstream side than on the upstream side.

3. The vaporizer according to claim 1, wherein ½ of a width or a depth of the passage is formed in a range of a temperature boundary layer of the liquid material.

* * * * *